United States Patent [19]

Anger et al.

[11] 4,238,680
[45] Dec. 9, 1980

[54] METHOD AND DEVICE FOR SETTING AND CORRECTING ERRORS OF AN ELECTRON OPTICAL CONDENSER OF A MICROPROJECTOR

[75] Inventors: Klaus Anger; Jüergen Frosien; Burkhard Lischke, all of Berlin, Fed. Rep. of Germany

[73] Assignee: Siemens Aktiengesellschaft, Berlin & Munich, Fed. Rep. of Germany

[21] Appl. No.: 39,878

[22] Filed: May 17, 1979

[30] Foreign Application Priority Data

Jun. 16, 1978 [DE] Fed. Rep. of Germany ....... 2827086

[51] Int. Cl.³ .............................................. G01K 1/08
[52] U.S. Cl. .................................. 250/397; 250/400; 250/492 A
[58] Field of Search ..................... 250/492 A, 397, 400

[56] References Cited

U.S. PATENT DOCUMENTS 3,745,358  7/1973  Firtz et al. ....................... 250/492 A
4,176,281  11/1979  Tischer et al. ................... 250/492 A Primary Examiner—Harold A. Dixon
Attorney, Agent, or Firm—Hill, Van Santen, Steadman, Chiara & Simpson

[57] ABSTRACT

A method and device for correcting errors and setting the focus of an electron optical condenser of a microprojector which condenser produces a bundle of axially parallel electron rays for illuminating a large surface transmission mask to create an image which is projected by means of an electron optical lens system on a surface of a wafer characterized by placing an annular field stop or diaphragm which passes a bundle of rays having a ring-shaped or annular cross section and recording the image in a plane preferably adjacent the surface of the wafer. The recording can be accomplished by utilizing a photographic plate or by utilizing a detector arrangement. When the image on the recording unit is the same size and shape as the annular field stop, then the electron optical condenser has the correct focal length and the source is disposed on the front focal plane.

7 Claims, 5 Drawing Figures

RING-SHAPED DETECTOR

PHOTOGRAPHIC PLATE

METHOD AND DEVICE FOR SETTING AND CORRECTING ERRORS OF AN ELECTRON OPTICAL CONDENSER OF A MICROPROJECTOR

BACKGROUND OF THE INVENTION

The present invention concerns a procedure or method and a device for setting the focus and correcting errors of an electronic optical condenser of a microprojector which condenser forms a bundle of axially parallel electron rays or beams, which are projected through a large area transmission mask to create an image which is projected on a surface of a wafer by means of an electronic optical imaging system or lens system.

In the manufacture of highly integrated switching circuits, a microprojector is utilized so that an image of a large area transmission mask can be projected on the surface of the wafer, for example a monocrystalline silicon wafer as a desired reduced image. In the course of the procedure, individual structural details must be directed upon one another so as to fit in case of successively performed exposures. With progressive miniaturization, the demands on the imaging and on the illuminating system increase. Expecially critical is the proper setting of the condenser in order to get an illumination of the mask, which illumination consists of rays which are as axially parallel as possible. Also, the electron source of the microprojector must lie exactly in the front focal plane of the condenser.

By computing or measuring the focal length, the necessary distance or spacing can be approximately determined. Besides this distance, the lens aberrations and the field distortions, which occur from external influences such as magnetic materials being unsymmetrically distributed to the external axis, must be corrected by stigmators. A complete computational determination of these errors is not possible. A measurement of the condenser lens field would have to be undertaken directly in the microprojects at its operating position which measurement could only be carried out with great technical expenditures and without the required accuracy.

SUMMARY OF THE INVENTION

The present invention is directed to checking the focus setting and an error correction of the condenser and where appropriate, enable correcting the setting and correction directly in the microprojector with simple means, quickly and repeatedly at any time. This method for setting the focus and correcting errors in the electron condenser of the micro projector, which projector serves for producing an image of a large surface transmission mask and projecting the image onto a wafer by means of an electron optical lens system with the electron optical condenser producing a bundle of axially parallel electron rays for illuminating large surface transmission masks comprises disconnecting the electron optical lens system, removing the transmission mask, positioning an annular field stop in the path of the beams leaving the electron optical condenser, said annular field stop allowing passage of a bundle of parallel rays or beams, said bundle having a cross section of an annular ring; adjusting the focal distance of the electron optical condenser and changing the settings of the stigmator associated therewith until the image of the annular field stop occurring through a shadow projection on a given plane beneath the lens system assumes the size and shape of the annular field stop.

The device for accomplishing the method includes an annular field stop being pivotably movable into the path of axially parallel electron rays at a position between the condenser lens and the lens system of the microprojector, said annular field stop enabling passage of a bundle of beams having a ring-shaped cross section and a recording unit positioned in the path of the rays at approximately the plane of the wafer for receiving a shadow image of the field stop. The recording unit can be photographic plate or can consist of a detector arrangement which is preferably a plurality of detectors arranged in the annular ring.

An advantage of the procedure or method is that no intervention into the condenser is necessary. Instead of measuring the field symmetry and the focal length exactly, a simple shadow projection is lead through an annular field stop or diaphragm which has a ring-shaped transmission window. In the case of the condenser, which has been corrected for errors in the frontal plane at which the electron source is located, the electron rays would all leave the condenser axially parallel. The shadow projection would then yield a one-to-one image of the annular field stop. The actual changes in the measured diameter of the shadow image from the diameter of the annular field stop will show a deviation of the focal setting for a predetermined setting of the condenser. For example, in order to obtain an edge location with an accuracy of $0.1\ \mu m$, the angular deviation of the electron rays may amount only to approximately $2\times 10^{-5}$ Rad. That means that the position determination of the shadow image at one meter distance from the annular field stop must be within $20\ \mu m$. For example, by changing of the stimulation in the case of a magnetic condenser lens, the focal length can be changed until the focal setting is correct.

The roundness of the shadow image is again a measurement for the correction state of the condenser lens. By a change of the excitation of the stigmators coordinated to this lens, the rotational symmetry of the condenser lens field can be optimized.

So that the method according to the present invention can be executed as simply as possible, it is advisable to provide an annular field stop, which is pivotable, between the condenser lens and the lens system as well as a recording unit which can be placed into the path of the rays in the plane of the wafer for the exposure or recording of the shadow image. These two means are already sufficient to check the focal setting and the rotational symmetry.

Since the error of the lens increases with an increased axial distance, it is especially important to assume a correct illumination for this area. Thus, the image field edge should be correctly illuminated.

In development of the invention, it is provided that the radius R of the annular field stop is approximately equal to the radius of the mask being used.

The recording unit used in the device is preferably made from a photographic plate. After development of the photographic plate, the recorded image can be measured and compared with the size of the annular field stop. For an optimum setting of the condenser, under some circumstances, a series of takes or exposures will be necessary.

In a further advantageous formation of the device according to the invention, the recording unit consists of a detector arrangement. With this the entire image blank can be covered by individual detectors, each detector is assigned to a particular location of the image surface. The image of the annular field stop can be reconstructed from the signals of the detectors which are illuminated with the shadow projection or image.

The advantages, which are present with the detector arrangement, are particularly obtained if the detector arrangement consists of a number of detectors arranged in a circle with a radius R that is equal to the radius R of the annular field stop. The signals of these detectors are fed to a control means for generating signals for automatic correction of the condenser focal length and the stigmator settings. In this manner, an automatic adjustment setting is created which changes the condenser and stigmator settings until all detectors on the circle are illuminated. With this arrangement, the result is achieved that the electron rays which pass through the annular field stop proceed axially parallel.

In an especially simple checking of the condenser setting and the error correction results with a ring-shaped detector arrangement on which the image of the annular field stop is guided in at least two directions by means for deflecting the beam which means is generally present in the imaging lens system. The detector signals are directed to a control means which compares the signals of the detectors during deflection of the beam in various directions and produces the signal for correction of the condenser focal length and/or the stigmator settings. The deflection directions will preferably lie orthogonal to one another. The form and size of the shadow image can be derived from the signal courses thus produced.

DESCRIPTION OF THE PREFERRED EMBODIMENTS

Figure 1:
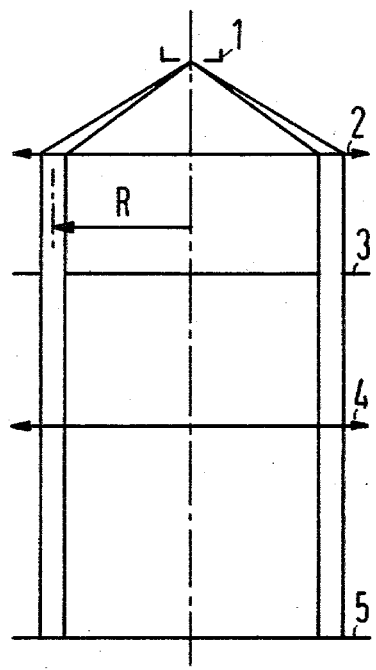
FIG. 1 schematically illustrates the path of rays of a microprojector with the focal setting and error correction.

The principles of the present invention are particularly useful in setting the focal length of an electron optical condenser 2 as schematically illustrated in FIG. 1 of a microprojector. The condenser 2, which may consist of a single electron optical lens or a multistage lens system, receives electron beams from a source 1 and projects them as a bundle through an annular field stop 3 or annular diaphragm. The stop or diaphragm has an annular or ring-shaped transmission window which passes a bundle of beams which bundle has an annular cross section with an average radius R. The width of the ring is disregardably small when compared to the radius R. When the source 1 is located at a focal plane of the lens 2, then the bundle will be axially parallel.

For the sake of completeness, a disconnected imaging lens sysem 4 is also schematically illustrated but since it is disconnected it will not effect the path of the rays. In the imaging system there is located electromagnetic deflection system 12 (FIG. 2) of which only coils are shown which are necessary for deflection in one direction. In order to be able to deflect the electron rays in all directions at least one additional pair of coils will be necessary.

Figure 5:
FIG. 5 is a side view of a photographic plate which can be used as a recording unit.

As the rays pass through the annular stop 3, they are projected on a recording unit in the plane 5 which recording unit can be photographic plate (see FIG. 5) which will record the shadow image of the annular field stop 3. This image is compared in size and form with the annular field stop. If, for example, the diameter of the image is smaller than the stop 3, then the distance of the source 1 from the condenser 2 is larger than the focal length of the condenser 2 and the bundle of rays leaving the condenser will be convergent. In this case, the excitement of the electron optical condenser must be reduced until the focal length increases a sufficient amount to cause the focal plane of the condenser and the source 1 to coincide.

Instead of variations in the excitement of the condenser, a mechanical displacement of the condenser along the optical axis could also occur. However, because of the size and weight, this mechanical displacement is only realized technically with a great expense in time and effort.

Figure 2:
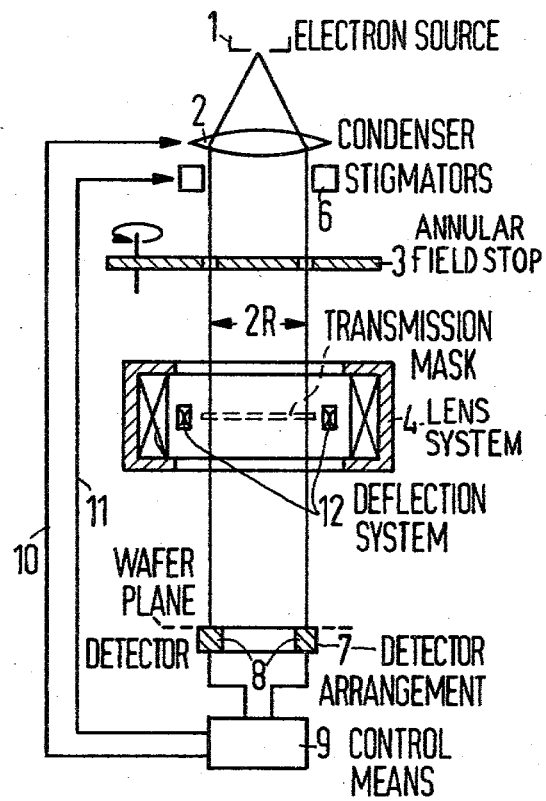
FIG. 2 is a schematic presentation showing the construction of a microprojector with the device in accordance with the present invention.
Figure 3:
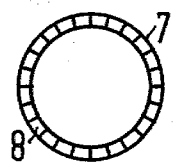
FIG. 3 is a plan view of a detector arrangement of FIG. 2.
Figure 4:
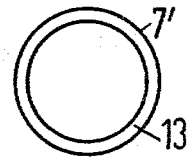
FIG. 4 is a plan view of an embodiment of a detector arrangement for use in a device of FIG. 2.

In FIG. 2, a microprojector with an automatic correction device is illustrated. The arrangement of the electron source 1, the condenser 2, and the imaging lens 4 correspond to the arrangement in FIG. 1. Beneath the condenser 2 additional stigmators 6 are schematically illustrated. The annular field stop 3, which is illustrated as having a ring-shaped window, is rotatably moved from the illustrated position in the path of the rays to a position out of the path of the rays when the images of the transmission mask is being projected onto a wafer. As a recording unit in this example, a detector arrangement 7 is used. The detector arrangement 7, as best illustrated in FIG. 3, consists of a number of detectors 8, which are arranged in a circle with the radius R which is the same as the radius of the window of the annular field stop or diaphragm. The signals produced in the detectors 8 are fed to a control means 9, which produces one signal schematically illustrated at 10 for correction of the condenser focal length and a signal 11 for correction of the stigmator settings. Instead of utilizing the detector arrangement 7 having a plurality of detector 8, a detector arrangement 7' of FIG. 4 comprising a ring-shaped detector can be utilized. As pointed out hereinabove, the ring shaped detector 13 enables checking the condenser setting and the error correction.

Although various minor modifications may be suggested by those versed in the art, it should be understood that we wish to embody within the scope of the patent warranted hereon, all such modifications as reasonably and properly come within the scope of our contributions to the art.

We claim:

1. A method for setting the focus and correcting errors of an electron optical condenser of a microprojector which microprojector serves for producing an image of a large surface transmission mask and projecting the image onto a wafer by means of electron optical lens system with the electron optical condenser producing a bundle of axially parallel electron rays for illuminating the large surface transmission mask, said process comprising disconnecting the electron optical lens system; removing the transmission mask; positioning an annular field stop in the path of the rays leaving the electron optical condenser, said annular field stop allowing passage of a bundle of parallel rays, said bundle having a cross section of an annular ring; adjusting the focal distance of the electron optical condenser; and changing the settings of the stigmators associated therewith until the image of the annular field stop occurring through a shadow projection on a given plane beneath the lens system assumes the size and shape of the annular field stop.

2. A device for setting the focus and correcting the errors of an electron optical condenser of a microprojector, said electron optical condenser of a microprojector, said electron optical condenser creating a bundle of axially parallel electron rays for projection through a large surface transmission mask to produce an image of the mask which images is subsequently projected by an electron optical lens system onto a surface of a wafer, said device including an annular field stop being pivotably movable into the path of the axially parallel electron rays at a position between the condenser lens and the lens system, said annular field stop enabling passage of a bundle of beams having a ring-shaped cross section; and a recording unit positioned in that path of rays in approximately the plane of the wafer for receiving a shadow image of the annular field stop.

3. A device according to claim 2, wherein the recording unit comprises a photographic plate.

4. A device according to claim 2, wherein the recording unit consists of a detector arrangement.

5. A device according to claim 4, wherein the annular ring stop has a radius R, wherein the detector arrangement consists of a plurality of detectors arranged on a circle with the radius R, the signals of each of said detectors being fed to a control means for generating an output signal for automatically correcting the focal length of the condenser lens and a signal for setting the stigmators.

6. A device according to claim 4, which includes means for deflecting the bundle of rays in at least two directions arranged between the annular field stop and the recording unit, said recording unit being a ring-shaped detector arrangement upon which the image of the annular field stop is directed by said means for deflecting, and a control means for receiving the signals and generating a signal for the correction of the focal length of the condenser lens and for setting the stigmators in response to a comparison of the signals received during different deflection directions of the bundle.

7. A device according to claim 2, wherein the annular field stop has a radius R approximately equal to the radius of the transmission mask.

* * * * *